US012690322B2

(12) United States Patent
Nie

(10) Patent No.: US 12,690,322 B2
(45) Date of Patent: Jul. 21, 2026

(54) QUANTUM DOT LIGHT-EMITTING DIODE AND FABRICATION METHOD THEREOF

(71) Applicant: TCL TECHNOLOGY GROUP CORPORATION, Huizhou (CN)

(72) Inventor: Zhiwen Nie, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 696 days.

(21) Appl. No.: 17/962,433

(22) Filed: Oct. 7, 2022

(65) Prior Publication Data

US 2023/0043770 A1      Feb. 9, 2023

Related U.S. Application Data

(63) Continuation of application No. PCT/CN2021/130260, filed on Nov. 12, 2021.

(30) Foreign Application Priority Data

Nov. 18, 2020    (CN) .......................... 202011294195.7

(51) Int. Cl.
| | |
|---|---|
| *H10K 71/00* | (2023.01) |
| *C09K 11/02* | (2006.01) |
| *C09K 11/56* | (2006.01) |
| *C09K 11/88* | (2006.01) |
| *H10K 50/115* | (2023.01) |
| *H10K 71/40* | (2023.01) |
| *H10K 85/10* | (2023.01) |

(52) U.S. Cl.
CPC .......... *H10K 50/115* (2023.02); *C09K 11/025* (2013.01); *C09K 11/565* (2013.01); *C09K 11/883* (2013.01); *H10K 71/40* (2023.02); *H10K 85/111* (2023.02); *H10K 85/1135* (2023.02)

(58) Field of Classification Search
CPC ...... H10K 50/115; H10K 50/80; H10K 71/00; H10K 71/40; H10K 85/111; H10K 85/1135; H10K 50/16; H10K 30/865; C09K 11/025; C09K 11/565; C09K 11/883; Y02P 70/50
USPC .......................................................... 257/40
See application file for complete search history.

(56) References Cited

U.S. PATENT DOCUMENTS

| | | | | |
|---|---|---|---|---|
| 2006/0249951 A1* | 11/2006 | Cruikshank | ............ | B42D 25/29 |
| | | | | 283/92 |
| 2012/0069080 A1* | 3/2012 | Yoshizawa | ............. | B41J 2/2107 |
| | | | | 347/20 |

(Continued)

FOREIGN PATENT DOCUMENTS

| | | |
|---|---|---|
| CN | 109929557 A | 6/2019 |
| CN | 109935661 A | 6/2019 |

(Continued)

OTHER PUBLICATIONS

The World Intellectual Property Organization (WIPO) International Search Report for PCT/CN2021/130260 Jan. 25, 2022 5 Pages.

*Primary Examiner* — Sheikh Maruf
(74) *Attorney, Agent, or Firm* — Anova Law Group, PLLC

(57)      ABSTRACT

The disclosure relates to a quantum dot light-emitting diode and a fabricating method thereof. The quantum dot light-emitting diode includes a quantum dot layer and an electron transport layer formed on the quantum dot layer. A surface of a side of the quantum dot layer close to the electron transport layer bonds to an ester substance.

14 Claims, 2 Drawing Sheets

| |
|---|
| anode |
| hole injection layer |
| hole transport layer |
| quantum dot layer |
| electron transport layer |
| cathode |
| substrate |

(56)            References Cited

U.S. PATENT DOCUMENTS

| | | | | |
|---|---|---|---|---|
| 2012/0125228 | A1* | 5/2012 | Iftime | C09D 11/38 |
| | | | | 106/31.14 |
| 2015/0274995 | A1* | 10/2015 | Dain | C09D 11/03 |
| | | | | 430/108.7 |
| 2018/0207928 | A1* | 7/2018 | Veis | B41F 23/0453 |
| 2018/0254421 | A1* | 9/2018 | Kinge | H10K 50/115 |
| 2019/0119565 | A1* | 4/2019 | Jeong | C09K 11/025 |
| 2019/0129302 | A1* | 5/2019 | Youn | G03F 7/027 |
| 2019/0157566 | A1* | 5/2019 | Ryu | H10K 85/633 |
| 2019/0280234 | A1* | 9/2019 | Wang | H10K 71/441 |
| 2020/0083450 | A1* | 3/2020 | Han | H10K 85/633 |
| 2020/0212333 | A1* | 7/2020 | Han | H10K 50/157 |
| 2020/0224095 | A1* | 7/2020 | Hong | C09K 11/70 |
| 2020/0259110 | A1* | 8/2020 | Angioni | H10K 50/15 |
| 2020/0299575 | A1* | 9/2020 | Ippen | C09K 11/883 |
| 2020/0403174 | A1* | 12/2020 | Kim | H10K 50/11 |
| 2020/0411719 | A1* | 12/2020 | Kimoto | H10K 50/165 |
| 2021/0020858 | A1* | 1/2021 | Qin | H10K 50/16 |

| | | | | |
|---|---|---|---|---|
| 2021/0024823 | A1* | 1/2021 | Nakata | H10K 71/12 |
| 2021/0071072 | A1* | 3/2021 | Chen | C07F 7/04 |
| 2021/0143356 | A1* | 5/2021 | Zhang | H10K 50/11 |
| 2021/0189233 | A1* | 6/2021 | Jung | C09K 11/883 |
| 2021/0269709 | A1* | 9/2021 | Choi | H10H 20/8512 |
| 2021/0332295 | A1* | 10/2021 | Wu | C09K 11/883 |
| 2021/0359240 | A1* | 11/2021 | Wu | H10K 50/15 |
| 2021/0371736 | A1* | 12/2021 | Lee | C07F 9/5442 |
| 2021/0371743 | A1* | 12/2021 | Liang | H10K 71/40 |
| 2022/0158106 | A1* | 5/2022 | Angioni | H10K 50/16 |
| 2022/0344604 | A1* | 10/2022 | Li | H10K 50/00 |

FOREIGN PATENT DOCUMENTS

| | | | |
|---|---|---|---|
| CN | 110718637 | A | 1/2020 |
| CN | 110739404 | A | 1/2020 |
| CN | 111384244 | A | 7/2020 |
| CN | 111384278 | A | 7/2020 |
| CN | 111490169 | A | 8/2020 |
| KR | 20190063544 | A | 6/2019 |

* cited by examiner

| cathode |
| electron transport layer |
| quantum dot layer |
| hole transport layer |
| hole injection layer |
| anode |
| substrate | provide a quantum dot layer having a surface bonding to an ester substance    ~S10 form an electron transport layer on the surface of the QD layer to which the ester substance bonds    ~S20 ligand exchange + esterification reaction first ligand ester substance

| anode |
| --- |
| hole injection layer |
| hole transport layer |
| quantum dot layer |
| electron transport layer |
| cathode |
| substrate |

QUANTUM DOT LIGHT-EMITTING DIODE AND FABRICATION METHOD THEREOF

CROSS-REFERENCES TO RELATED APPLICATIONS

The present application is continuation of International Application No. PCT/CN2021/130260, filed on Nov. 12, 2021, which claims the priority of Chinese Patent Application No. 202011294195.7, filed on Nov. 18, 2020, the entire contents of both of which are incorporated herein by reference.

TECHNICAL FIELD

The present disclosure relates to the field of quantum dot light-emitting devices and, in particular, to a quantum dot light-emitting diode and a fabrication method thereof.

TECHNICAL BACKGROUND

Quantum dots (QDs) are usually composed of tens to millions of atoms, and their geometric dimensions are similar to those of excitons. QDs not only partially inherit the characteristics of bulk semiconductors, but also exhibit their own unique optoelectronic properties. In particular, QDs have high color purity, a continuously emission spectrum adjustable based on size and composition, a narrow full width at half maximum, high fluorescence efficiency, a long life, excellent monodispersity and photothermal stability, and also have excellent solution processability, etc. QDs have a wide range of application prospects in the fields of display, laser, photovoltaic, and biomarkers. Among them, the application of QDs in the display field, especially the QD-LCD TV vigorously promoted by manufacturers such as TCL and Samsung, also marks its initial commercial transformation has begun to take shape.

With the continuous improvement of QDs synthesis technology, the continuous optimization of device structure, and the deepening of theoretical research on the life of quantum dot light-emitting diode (QLED) devices, the efficiency and life of the device have been significantly improved. In particular, the device performance of red and green QLEDs has been comparable to the existing widely used organic light-emitting diodes (OLEDs), marking a solid step towards the real commercialization of QLEDs. Existing high-performance QLEDs usually use ZnO having high electron mobility as the electron transport layer. On one hand, this kind of ZnO is usually prepared by a low-temperature solution method, and its surface exhibits polarity. When a ZnO layer is deposited on the QD light-emitting layer, the contact angle between the polar surface of ZnO and the non-polar surface of the QDs is large, the film-forming property of ZnO nanoparticles becomes poor, and electron injection becomes difficult. In addition, the structure of the QDs surface is chaotic and disordered, the crystal lattice is incomplete, and the electrical properties of the QD layer is changed. On the other hand, since the electron mobility of the existing QLED device structure is much higher than the hole mobility, the charge accumulates seriously at the interface between the QDs and the electron transport layer, which not only causes the device to generate excessive heat, but also causes the voltage to rise, and causes the life and efficiency to exhibit a significant reduction trend.

Therefore, the traditional technology still needs to be improved and developed.

SUMMARY

In view of the deficiencies of the above-mentioned traditional technologies, the purpose of the present disclosure is to provide a quantum dot light-emitting diode (QLED) and a fabrication method thereof, aiming at solving the problem that a large polarity difference between the QD layer and the electron transport layer leads to poor film formation quality of the electron transport layer.

The technical solutions of the present disclosure are as follows.

A first aspect of the present disclosure provides a QLED, including: a QD layer and an electron transport layer formed on the QD layer, where a surface of a side of the QD layer close to the electron transport layer bonds to an ester substance.

In the present disclosure, the surface of the side of the QD layer where the electron transport layer is located is replaced with an ester substance. The ester substance has good hydrophilicity, and its polarity is the same as that of the electron transport layer. As such, the ester substance effectively improves the compatibility between the QD layer and the electron transport layer, reduces the surface contact angle between the QD layer and the electron transport layer, and fills the gaps and defects between the film layers, thereby effectively avoiding the occurrence of non-radiative recombination, reducing leakage current, and significantly improving the luminous performance of the device.

A second aspect of the present disclosure provides a fabrication method of a QLED, including the following steps: providing a QD layer having a surface bonding to an ester substance; and forming an electron transport layer on the surface of the QD layer to which the ester substance bonds.

In the present disclosure, the surface of the side of the QD layer where the electron transport layer is located is replaced with an ester substance, while the rest area of the QD layer remains a non-polar ligand of the QD. Due to the good hydrophilicity of the ester substance, the surface of the QD layer in contact with the electron transport layer is in a polar state, and the rest of the QD layer remains in the original non-polar state. In this way, the compatibility between the QD layer and the electron transport layer is effectively improved, the surface contact angle between the QD layer and the electron transport layer is reduced, and the gaps and defects between the film layers are filled, thereby effectively avoiding the occurrence of non-radiative recombination, reducing leakage current, and significantly improving the luminous performance of the device.

DETAILED DESCRIPTION

Figure 1:
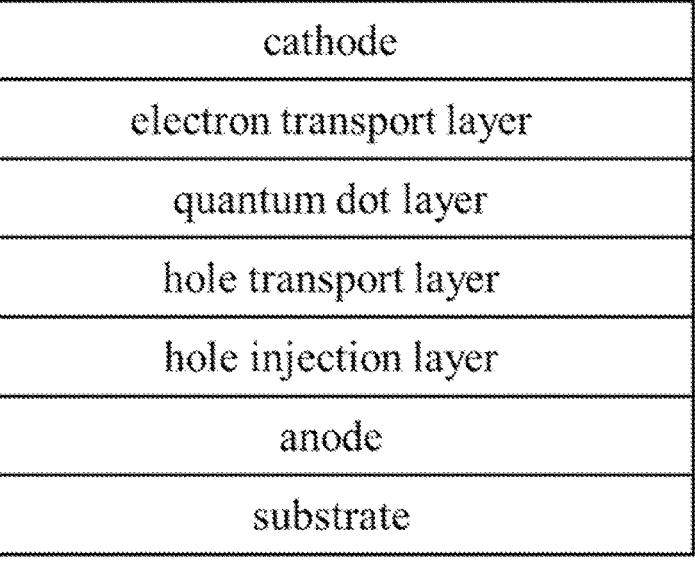
FIG. 1 is a schematic structural diagram of a QLED according to some embodiments of the present disclosure.

The present disclosure provides a quantum dot light-emitting diode (QLED) and a fabrication method thereof. In order to make the purpose, technical solution, and effect of the present disclosure clearer, and more explicit, the present disclosure will be further described in detail below. It should be understood that the embodiments described herein are only used to explain the present disclosure, but not to limit the present disclosure.

Embodiments of the present disclosure provide a QLED, which includes a quantum dot (QD) layer and an electron transport layer formed on the QD layer, where a surface of a side of the QD layer close to the electron transport layer bonds to an ester substance.

In existing QLEDs, the surface of the entire QD layer is usually coordinated with original ligands. In the QLED of this embodiments, the surface of the QD layer that is in contact with the electron transport layer is replaced with an ester substance, and the rest of the QD layer remains the original ligand. According to the principle of the repulsion of the same charge and the attraction of different charges, when the surface ligand of the QD layer near the electron transport layer is replaced with an ester substance, the injection of electrons with the same charge as the ester functional group can be hindered to a certain extent, while the original ligand in a part of the QD layer can accelerate, to a certain extent, the injection of holes opposite to the charge of the functional group of the ligand. As such, it is helpful to improve the injection balance of electrons and holes, improve the recombination efficiency of carriers in the entire QD layer, and improve device performance.

In addition, in the existing QLEDs, the original ligands coordinated with the QDs are usually non-polar ligands, the entire surface of the QD layer is in a non-polar state. However, the surface of the electron transport layer in contact with the QD layer is in a polar state. The large difference in polarity between the QD layer and the electron transport layer results in large surface contact angle between the QD layer and the electron transport layer, a large number of defects, difficult electron injection, serious non-radiative recombination, and poor luminescence performance of the device. In view of such technical problem, the existing method is to first perform ligand exchange in the form of QD solution, and then deposit the QD solution after ligand exchange to form a QD layer. The method can improve the compatibility between the QD layer and the electron transport layer. Although this method can achieve efficient ligand exchange, the ligand exchange occurs on all QD surfaces, which leads to a significant decrease in the self-fluorescence efficiency of QDs.

In the QLED of this embodiment, the region of the QD layer close to the electron transport layer is replaced with an ester substance, the rest of the QD layer remains the non-polar ligand of the QD. Due to the good hydrophilicity of the ester substance, the surface of the QD layer in contact with the electron transport layer is in a polar state, and the rest of the QD layer remains in the original non-polar state. In such way, under the premise that the fluorescence efficiency of QDs is not lost, the compatibility between the QD layer and the electron transport layer can be effectively improved, the surface contact angle between the QD layer and the electron transport layer can be reduced, and the gaps and defects between the film layers can be filled, the occurrence of non-radiative recombination can be effectively avoided, the leakage current can be reduced, and the luminous performance of the device can be significantly improved.

In one embodiment, a surface of a side of the QD layer away from the electron transport layer bonds to a first ligand (i.e., the original ligand to which the QDs bonds).

In one embodiment, the first ligand can be one or more selected from: an organic carboxylic acid with 8 or more carbon atoms, a primary amine with 8 or more carbon atoms, a secondary or tertiary amine with 4 or more branched carbon atoms, and an organophosphine with 4 or more branched carbon atoms, etc. As an example, the first ligand is an organic carboxylic acid with 8 or more carbon atoms, or an organophosphine with 4 or more branched carbon atoms, or a combination of an organic carboxylic acid with 8 or more carbon atoms and a primary amine with 8 or more carbon atoms, or a combination of a primary amine with 8 or more carbon atoms, a secondary or tertiary amine with 4 or more branched carbon atoms, and an organophosphine with 4 or more branched carbon atoms.

In one embodiment, the first ligand can be one or more selected from: an organic carboxylic acid with 8 or more but no more than 20 carbon atoms, a primary amine with 8 or more but no more than 20 carbon atoms, a secondary or tertiary amine with 4 or more but no more than 20 branched carbon atoms, and an organophosphine with 4 or more but no more than 20 branched carbon atoms, etc.

As an example, the organic carboxylic acid with 8 or more but no more than 20 carbon atoms can be one or more selected from: caprylic acid, nonanoic acid, capric acid, undecyl acid, dodecyl acid, tridecyl acid, tetradecyl acid, hexadecyl acid, octadecyl acid, undecenoic acid, dodecenoic acid, tridecenoic acid, tetradecenoic acid, pentadecenoic acid, hexadecenoic acid, heptadecenoic acid and octadecenoic acid, etc.

As an example, the primary amine with 8 or more but no more than 20 carbon atoms can be one or more selected from: octylamine, nonylamine, decylamine, dodecylamine, tetradecylamine, hexadecylamine, and octadecylamine, etc.

As an example, the secondary or tertiary amine with 4 or more but no more than 20 branched carbon atoms can be one or more selected from: tributylamine, trihexylamine, triheptylamine, trioctylamine, trinonylamine and tridecylamine, etc.

As an example, organophosphines with 4 or more but no more than 20 branched carbon atoms can be one or more selected from: tributylphosphine, trihexylphosphine, triheptylphosphine, trioctylphosphine, trinonylphosphine and tridecylphosphine, etc.

In one embodiment, the ester substance is formed by an esterification reaction of a second ligand and a third ligand, and the second ligand and the third ligand bond to the surface of the QD layer.

In one embodiment, the carbon chain length of the first ligand is the same as the carbon chain lengths of the second and third ligands that form the ester substances, and the molar ratio of the second ligand to the third ligand is 1:1. For example, when the first ligand is undecanoic acid, the second ligand is 11-mercaptoundecanoic acid, the third ligand is 11-mercapto-1-undecanol, where the molar ration of 11-mercaptoundecanoic acid to 11-mercapto-1-undecanol is 1:1. In this embodiment, the carbon chains of each ligand have the same length, which can further avoid the problem that the self-fluorescence efficiency of QDs is greatly reduced due to conventional ligand replacement.

In one embodiment, one end of the carbon chain of the second ligand is a sulfhydryl group, and the other end is a carboxyl group, and the second ligand bonds to the surface of the QD layer through the sulfhydryl group. The carbon chain of the second ligand may be the same as the carbon chain of the first ligand.

In one embodiment, one end of the carbon chain of the third ligand is a sulfhydryl group, and the other end is a hydroxyl group, and the third ligand bonds to the surface of the QD layer through the sulfhydryl group. The carbon chain of the third ligand may be the same as the carbon chain of the first ligand.

Figures 3, 4:
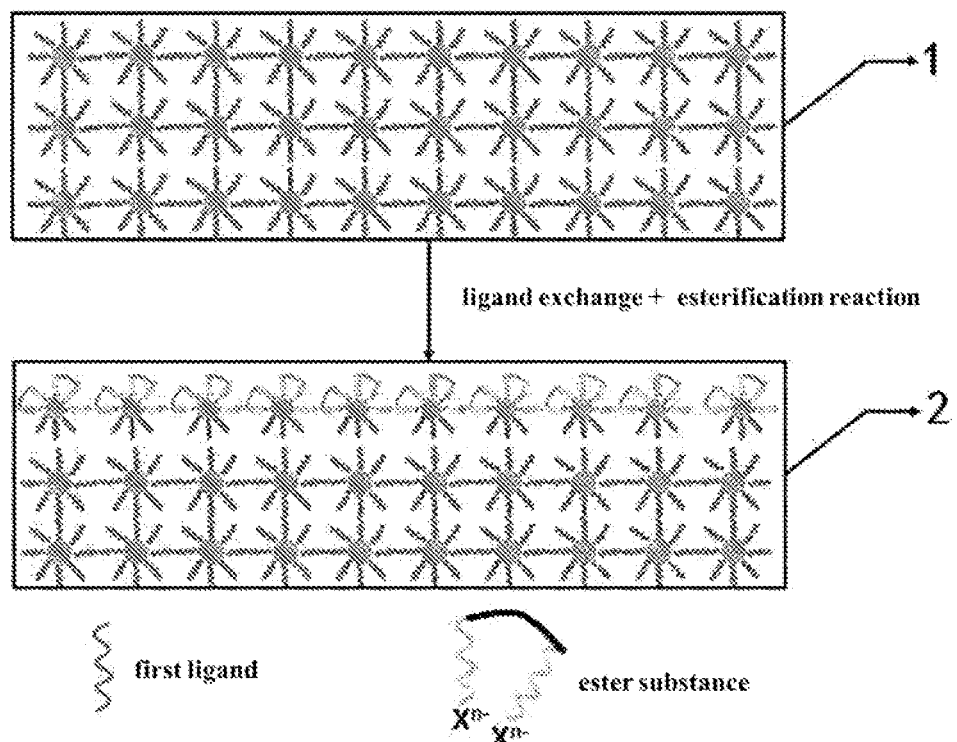
FIG. 3 is a schematic diagram of the QD layer before and after processing (ligand exchange+esterification reaction) according to some embodiments of the disclosure.
FIG. 4 is a schematic structural diagram of an inversed QLED according to some embodiments of the present disclosure.

In this embodiment, the QLEDs are divided into two types: a positive structure and an inversed structure, and the QLEDs of each structure may have various forms. The structure and material selection of the QLED of this embodiment will be described below by taking the QLED of the positive structure shown in FIG. 1 as an example. As shown in FIG. 1, the QLED includes a substrate, an anode, a hole injection layer, a hole transport layer, a QD layer, an electron transport layer, and a cathode in sequence from bottom to top, where the surface of a side the QD layer close to the electron transport layer bonds to an ester substance. As shown in FIG. 4, the QLED of the inversed structure of the present disclosure includes a substrate, a cathode, an electron transport layer, a QD layer, a hole transport layer, a hole injection layer, and an anode in sequence from bottom to top.

In one embodiment, the substrate may be a rigid substrate or a flexible substrate. The substrate is selected from: glass, silicon wafer, polycarbonate, polymethyl methacrylate, polyethylene terephthalate, polyethylene naphthalate, polyamide, polyethersulfone, or combinations thereof, and the like.

In one embodiment, the material of the anode can be selected from: nickel, platinum, vanadium, chromium, copper, zinc, gold, or their alloys. The material of the anode can also be one or more selected from: zinc oxide, indium oxide, tin oxide, indium zinc oxide, indium-doped tin oxide, fluorine-doped tin oxide, antimony-doped tin oxide, and aluminum-doped zinc oxide. The material of the anode can be a combination of any two or more of the above.

In one embodiment, the material of the hole injection layer may be selected from materials with good hole injection properties, such as one or more of, but not limited to, poly(3,4-ethylenedioxythiophene)-polystyrenesulfonic acid (PEDOT:PSS), copper phthalocyanine (CuPc), 2,3,5,6-tetrafluoro-7,7',8,8'-tetracyanoquinone-dimethane (F4-TCNQ), 2,3,6,7,10,11-hexacyano-1,4,5,8,9,12-hexaazatriphenylene (HATCN), doped or undoped transition metal oxides, doped or undoped metal chalcogenide compounds; where transition metal oxides include one or more of, but are not limited to $MoO_3$, $VO_2$, $WO_3$, and CuO; and metal chalcogenide compounds include one or more of, but are not limited to $MoS_2$, $MoSe_2$, $WS_2$, $WSe_2$, and CuS. In one embodiment, the hole injection layer has a thickness of 10-150 nm.

In one embodiment, the material of the hole transport layer can be selected from organic materials with good hole transport ability, such as one or more of, but not limited to, poly(9,9-dioctylfluorene-CO—N-(4-Butylphenyl)diphenylamine)(TFB), polyvinylcarbazole (PVK), poly(N,N'bis (4-butylphenyl)-N,N'-bis(phenyl)benzidine)(Poly-TPD), poly(9,9-dioctylfluorene-co-bis-N,N-phenyl-1,4-phenylenediamine) (PFB), 4,4',4"-tris(carbohydrate) oxazol-9-yl)triphenylamine (TCTA), 4,4'-bis(9-carbazole)biphenyl (CBP), N,N'-diphenyl-N,N'-bis(3-methyl) Phenyl)-1,1'-biphenyl-4,4'-diamine (TPD), N,N'-Diphenyl-N,N'-(1-naphthyl)-1,1'-biphenyl-4,4'-diamine (NPB), doped graphene, undoped graphene, and $C_{60}$. In one embodiment, the hole transport layer has a thickness of 10-150 nm.

In one embodiment, the QDs may be selected from group II-VI CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe; or group III-V GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb; or group IV-VI SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe; or a combination of any one or more of the above.

In one embodiment, the electron transport layer may be one or more selected from: ZnO, $TiO_2$, Alq3, SnO, ZrO, AlZnO, ZnSnO, BCP, TAZ, PBD, TPBI, Bphen, $CsCO_3$. In one embodiment, the electron transport layer has a thickness of 5-100 nm.

In one embodiment, the cathode may be selected from metals or alloys thereof, such as magnesium, calcium, sodium, potassium, titanium, indium, yttrium, lithium, gadolinium, aluminum, silver, tin, lead, cesium, barium, or alloys thereof. The cathode can also be composed of multi-layer structural materials, such as a first layer and a second layer located on the first layer, where the material of the first layer is alkali metal halide, alkaline earth metal halide, alkali metal oxide, or a combination thereof, and the material of the second layer is an alkaline earth metal, a Group III metal, or a combination thereof. For example, the cathodes can be, but not limited thereto LiF/Al, $LiO_2$/Al, LiF/Ca, Liq/Al, and $BaF_2$/Ca.

Figure 2:
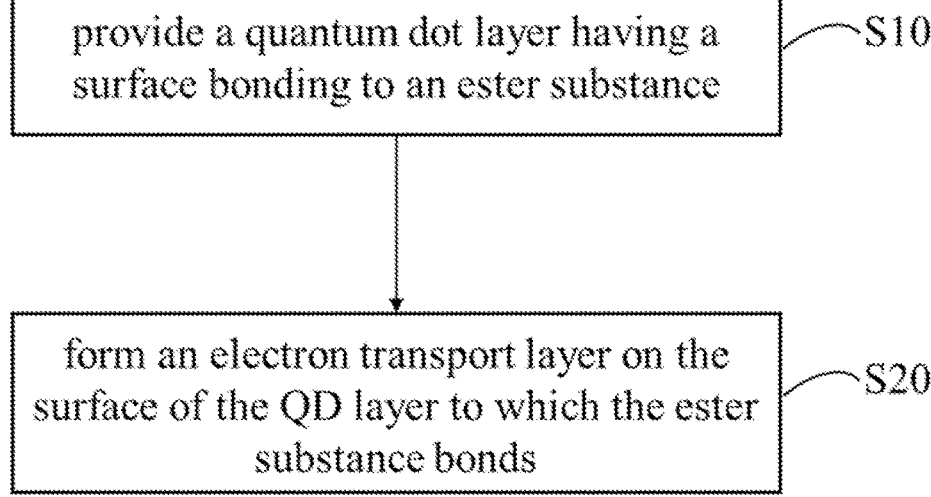
FIG. 2 is a schematic flowchart of a fabrication method of a QLED according to some embodiments of the present disclosure.

An embodiment of the present disclosure provides a fabrication method of a QLED, as shown in FIG. 2, including the following steps:

S10, providing a QD layer having a surface bonding to an ester substance;

S20, forming an electron transport layer on the surface of the QD layer to which the ester substance bonds.

In the QLED of this embodiment, the region of the QD layer close to the electron transport layer is replaced with an ester substance, the rest of the QD layer remains the non-polar ligand of the QD. Due to the good hydrophilicity of the ester substance, the surface of the QD layer in contact with the electron transport layer is in a polar state, and the rest of the QD layer remains in the original non-polar state. In such way, under the premise that the fluorescence efficiency of QDs is not lost, the compatibility between the QD layer and the electron transport layer can be effectively improved, the surface contact angle between the QD layer and the electron transport layer can be reduced, and the gaps and defects between the film layers can be filled, the occurrence of non-radiative recombination can be effectively avoided, the leakage current can be reduced, and the luminous performance of the device can be significantly improved.

In step S10, in one embodiment, a fabrication method of a QD layer having a surface bonding to an ester substance includes the following steps:

S11, providing a QD layer of which two surfaces (for example, the upper surface and the lower surface in FIG. 3) both bond to a first ligand;

S12. Under the vacuum condition of $<5 \times 10^{-4}$ Pa, performing ligand exchange on the first ligand of one (for example, the upper surface in FIG. 3) of the two surfaces of the QD layer with the second ligand and the third ligand;

S13, making the second ligand and the third ligand to undergo an esterification reaction obtain a QD layer having an ester substance bonding to the surface.

In this embodiment, when the second ligand and the third ligand are added to the surface of the QD layer bond with the first ligand, under the dual induction of the difference in ligand concentration and the interaction between the cations on the surface of the QDs and the functional groups of the second and third ligands, the second ligand and the third ligand may diffuse directly in the direction of the hole transport layer (usually the QD layer is located on the surface of the hole transport layer), thereby inducing occurrence of ligand exchange on partial ligands of the surface of the QD layer (the surface to be in contact with the electron transport layer) Meanwhile, in order to prevent ligand exchange from occurring on the entire QD film layer due to too large concentration difference, vacuum treatment is performed above the QD film layer (vacuum condition is $<5\times10^{-4}$ Pa). Under the vacuum condition, an upward pulling force is applied to the ligand to be exchanged, so as to better balance that the ligand exchange occurs in the entire QD film layer due to the excessive concentration difference. The region in contact with the hole transport layer does not undergo ligand exchange, and this region are still coordinated with the original ligand (i.e., the first ligand) of the QD. Before ligand exchange, the surfaces of all QDs in the QD layer are coordinated with the first ligand. After ligand exchange, the surface of the QD layer close to the side of the electron transport layer is simultaneously coordinated with the second ligand and the third ligand, while the remaining regions maintain the original first ligand. The above-mentioned ligand exchange method can effectively avoid, without losing the original fluorescence efficiency of the QDs, the problem that the self-fluorescence efficiency of the QDs is greatly reduced due to the conventional ligand exchange, and realize occurrence of ligand exchange on the partial area of the surface of the QDs.

Next, after ligand exchange, the second ligand and the third ligand on the surface of the QD layer undergo an esterification reaction to generate an ester substance. The ester substance has good hydrophilicity, and its polarity is the same as that of the electron transport layer. As such, the ester substance effectively improves the compatibility between the QD layer and the electron transport layer, reduces the surface contact angle between the QD layer and the electron transport layer, and fills the gaps and defects between the film layers, thereby effectively avoiding the occurrence of non-radiative recombination, reducing leakage current, and significantly improving the luminous performance of the device. In addition, this embodiment has the advantages of simple, mild, effective, fast, and universality, etc., and is very suitable for the large-scale application of QDs in the future.

As shown in FIG. 3, before ligand exchange, the surfaces of all QDs in the QD layer 1 are coordinated as the first ligand. After ligand exchange and esterification, the surface ligands near the electron transport layer in QD layer 2 are replaced by ester substance (obtained by the esterification of the second ligand and the third ligand), while the rest regions retain the original first ligand. According to the principle of the repulsion of the same charge and the attraction of different charges, when the surface ligand of the QD layer near the electron transport layer is replaced with an ester substance, the injection of electrons with the same charge as the ester functional group can be hindered to a certain extent; while the original ligand in a part of the QD layer can accelerate to a certain extent the injection of holes opposite to the charge of the functional group of the ligand. This helps to improve the injection balance of electrons and holes, improve the recombination efficiency of carriers in the entire QD layer, and improve device performance In step S11, in the QD layer with the surface bonding to the first ligand, the first ligand, is the original ligand of the QD, and the surface of a side the original QD layer away from the hole transport layer exhibits non-polarity. Please refer to the above for the type of the first ligand, which is not repeated here. It should be noted that, in this step, in the QD layer, the surfaces of all the QDs bond to the first ligand, so the surface of the entire QD layer exhibits non-polarity.

In one embodiment, the QD layer is prepared by the following method: spin-coating the prepared QD solution on the prepared hole transport layer, and then performing thermal annealing treatment to obtain the QD layer. The film thickness can be controlled by adjusting the concentration of the solution, the spin coating speed, and the spin coating time. The QDs are QDs having surface bonding to the first ligand. In one embodiment, the thickness of the QD layer may be 20-60 nm, e.g., 30 nm.

In one embodiment, the QD solution has a concentration of 10-30 mg/mL. In one embodiment, the solvent used to disperse the QDs can be at least one selected from, but is not limited to: n-octane, n-hexane, cyclohexane, cyclooctane, etc.

In one embodiment, step S12 includes: adding a second ligand and a third ligand on one surface of the QD layer, and then performing spin coating in a vacuum of $<5\times10^{-4}$ Pa, at a spin coating speed of 100-2000 rpm, for spin coating time of 10-120 s, and using the second ligand and the third ligand to perform ligand exchange with the first ligand located on one surface of the QD layer; and after the ligand exchange is completed, cleaning and finally drying the surface of the QD layer to obtain a QD layer having a surface bonding to the second ligand and the third ligand.

In one embodiment, the second ligand and the third ligand are added to one surface of the QD layer according to the ratio of the total volume of the second ligand and the third ligand to the mass of the QDs of 0.01-10:1 mL/mg to perform ligand exchange. In one embodiment, the molar ratio of the second ligand to the third ligand is 1:1.

In one embodiment, after completion, the surface of the QD layer is cleaned by adding a small amount of isopropanol, and is finally dried at 50-120° C. for 0.5-4 h to obtain a QD layer having a surface bonding to the second ligand and the third ligand. In one embodiment, the ratio of the volume of isopropanol to the total volume of the second ligand and the third ligand is 1-20:1.

In one embodiment, the lengths of the carbon chain of the first ligand, the carbon chain of the second ligand, and the carbon chain of the third ligand are the same. For example, when the first ligand is undecanoic acid, the second ligand is 11-mercaptoundecanoic acid, the third ligand is 11-mercapto-1-undecanol, the molar ratio of the 11-mercaptoundecanoic acid to the 11-mercapto-1-undecanol is 1:1. Since the lengths of the carbon chain of the second ligand and the carbon chain of the third ligand are the same as the length of the carbon chain of the first ligand, it is equivalent to that in-situ ligand exchange occurs on the surface of the QDs that is in contact with the electron transport layer, which further ensures that, on the premise that the fluorescence of the original QDs is not lost, the problem that the conventional ligand exchange significantly causes significant decrease of the self-fluorescence efficiency of the QDs is effectively avoided.

In this embodiment, one end of the carbon chain of the second ligand is a sulfhydryl group, and the other end is a carboxyl group, and the second ligand bonds to the surface of the QD layer through the sulfhydryl group. The carbon chain of the second ligand may be the same as the carbon chain of the first ligand.

In this embodiment, one end of the carbon chain of the third ligand is a sulfhydryl group, and the other end is a hydroxyl group, and the third ligand bonds to the surface of the QD layer through the sulfhydryl group. The carbon chain of the third ligand may be the same as the carbon chain of the first ligand.

In this embodiment, generally, the first ligand may be an organic carboxylic acid, primary amine, secondary amine, tertiary amine, or organic phosphine, etc. Since the binding force of the sulfhydryl group in the second ligand and the third ligand to the QD is greater than the binding force of the carboxyl group, the amine group, phosphoric acid, etc. to the QD. Therefore, the coordination ability of the second ligand and the coordination ability of the third ligand are both greater than the coordination ability of the first ligand, which is conducive to promoting ligand exchange.

In step S13, in one embodiment, the step of making the second ligand and the third ligand undergo an esterification reaction includes: under the catalysis of an inorganic acid, the second ligand and the third ligand are subjected to an esterification reaction, where the temperature of the esterification reaction is 50-180° C., and the time of the esterification reaction is 0.5-4 h. In this embodiment, the inorganic acid is used as a catalyst to catalyze the reaction between the carboxyl group at one end of the second ligand and the hydroxyl group at one end of the third ligand to generate an ester substance.

In one embodiment, after the esterification reaction is completed, the method further includes the following step: the surface of the QD layer is cleaned by adding a small amount of isopropanol and is finally dried at 50-120° C. for 0.5-4 h.

In one embodiment, the inorganic acid may be at least one of dichromic acid, diphosphoric acid, hypoiodic acid, hypochlorous acid, hypobromous acid, hypophosphorous acid, hyposulfuric acid, superoxic acid, iodic acid, telluric acid, fluoroboric acid, fluorosilicic acid, fluoroantimonic acid, fluorophosphoric acid, fluorosulfuric acid, fluoroplatinic acid, fluorooxyacid, vanadic acid, perchloric acid, permanganic acid, ferric acid, periodic acid, perbromic acid, perxenic acid, chromic acid, silicic acid, cobalt acid, peroxymonosulfuric acid, peroxodisulfuric acid, peroxydicarbonic acid, perboric acid, percarbonic acid, peroxyacid, pyrophosphoric acid, pyrosulfuric acid, pyrosulfite, dithionous acid, dithionite, phosphoric acid, phosphomolybdic acid, thiosulfuric acid, sulfuric acid, thiocyanic acid, chloric acid, chloroauric acid, chloroplatinic acid, chlorosulfonic acid, aluminum acid, manganic acid, molybdic acid, nickel acid, boric acid, metaboric acid, metaphosphoric acid, metaarsenic acid, metaaluminate acid, lead acid, cyanic acid, hydroiodic acid, hydroazido acid, hydrotelluric acid, hydrofluoric acid, hydrosulfuric acid, hydrochloric acid, hydrocyanic acid, hydrobromic acid, arsenic acid, trisilicic acid, tetraboric acid, tetrahydroxyaluminate, tetrahydroxycupric acid, titanic acid, carbonic acid, ferric acid, tungstic acid, nitric acid, selenic acid, stannic acid, zinc acid, bromic acid, xenon acid, tellurous acid, sulfurous acid, phosphorous acid, chlorous acid, hydrochloric acid, chromous acid, lead acid, arsenous acid, nitrous acid, selenous acid, stannous acid, uranic acid, orthosilicic acid, orthophosphoric acid, orthosulfuric acid, orthocarbonic acid at least one of, but not limited thereto.

In this embodiment, the obtained QLED can be packaged. The packaging processing can be performed by a common machine encapsulation or can be a manual packaging. In one embodiment, the oxygen and the water in the packaging process are both lower than 0.1 ppm to ensure the stability of the device.

The present disclosure will be described in detail through the embodiments below.

Embodiment 1

1. In Embodiment 1 of the present disclosure, 11-mercaptoundecanoic acid and 11-mercapto-1-undecanol were used for ligand exchange with the CdZnSe/ZnSe/ZnS QD layer, and then the QD layer was obtained by esterification reaction. The original ligand of the QDs was undecanoic acid.

(1) First, a CdZnSe/ZnSe/ZnS QD layer was deposited on the hole transport layer. The QD concentration was 20 mg/mL, the solvent was n-octane, and the volume was 0.8 mL.

(2) Then, 0.4 mL of 11-mercaptoundecanoic acid and 11-mercapto-1-undecanol (the molar ratio therebetween is 1:1) was added dropwise to the surface of the QD layer, and then under vacuum conditions, spin coating (speed of 1000 rpm, time of 2 min) was performed at $6 \times 10^{-4}$ Pa. After completion, 1.5 mL of isopropanol was added to rinse the surface of the QD layer.

(3) Next, 0.1 mL of HCl was added dropwise to the surface of step (2), and then the QD layer was placed at 100° C. to undergo an esterification reaction for 60 min to obtain the ester substance bonding to the surface of the QD layer. After completion, a small amount of isopropanol was added to rinse the surface of the QD layer.

2. Fabrication of QLED

The QLED of this embodiment included, from bottom to top, an anode, a hole injection layer, a hole transport layer, a QD layer, an electron transport layer, and a cathode sequentially deposited on a substrate. The substrate was a glass substrate; the anode was ITO with a thickness of 110 nm; the hole injection layer was PEDOT:PSS with a thickness of 90 nm; and the hole transport layer was TFB with a thickness of 70 nm. The QD layer was the QD layer prepared in the above step 1, and the thickness thereof was 60 nm. The electron transport layer was ZnO with a thickness of 50 nm; and the cathode was Al with a thickness of 60 nm.

The main difference between Comparative Example 1 provided by the present disclosure and Embodiment 1 is that the QD layer did not undergo the ligand exchange process (i.e., step (2)) and the esterification reaction process (i.e., step (3)) in the above step 1.

Embodiment 2

1. In Embodiment 2 of the present disclosure, 11-Mercaptoundecanoic acid and 11-Mercapto-1-undecanol were used for ligand exchange with the CdxZnl-xSe/CdyZn$_{1-y}$Se/ZnSe/CdZnS ($0<x<1$, $0<y<1$, and $x<y$) quantum layer, followed by esterification to obtain a QD layer. The original ligand of QDs was undecanoic acid.

(1) First, a Cd$_x$Zn$_{1-x}$Se/Cd$_y$Zn$_{1-y}$Se/ZnSe/CdZnS ($0<x<1$, $0<y<1$, and $x<y$) QD layer was deposited on the hole transport layer. The QD concentration was 20 mg/mL, the solvent was n-octane, and the volume was 0.8 mL.

(2) Then, 0.4 mL of 11-mercaptoundecanoic acid and 11-mercapto-1-undecanol (the molar ratio therebetween is 1:1) was added dropwise to the surface of the QD layer, and then under vacuum conditions, spin coating (speed of 1000 rpm, time of 2 min) was performed at $6 \times 10^{-4}$ Pa. After completion, 1.5 mL of isopropanol was added to rinse the surface of the QD layer.

(3) Next, 0.1 mL of HCl was added dropwise to the surface of step (2), and then the QD layer was dried at 100° C. for 60 min to obtain the ester substance bonding to the surface of the QD layer. After completion, a small amount of isopropanol was added to rinse the surface of the QD layer.

2. Fabrication of the QLED

The QLED of this embodiment included, from bottom to top, an anode, a hole injection layer, a hole transport layer, a QD layer, an electron transport layer, and a cathode sequentially deposited on a substrate. The substrate was a glass substrate; the anode was ITO with a thickness of 110 nm; the hole injection layer was PEDOT:PSS with a thickness of 90 nm; and the hole transport layer was TFB with a thickness of 70 nm. The QD layer was the QD layer prepared in the above step 1, and the thickness thereof was 60 nm. The electron transport layer was ZnO with a thickness of 50 nm; and the cathode was Al with a thickness of 60 nm.

The main difference between Comparative Example 2 provided in the present disclosure and Example 2 is that the QD layer did not undergo the ligand exchange process (i.e., step (2)) and the esterification reaction process (i.e., step (3)) in the above step 1.

Embodiment 3

1. Embodiment 3 of the present disclosure 11-Mercaptoundecanoic acid and 11-Mercapto-1-undecanol were used for ligand exchange with the $Cd_xZn_{1-x}S/Cd_yZn_{1-y}S/ZnS$ $(0<x<1, 0<y<1, and x<y)$, followed by esterification to obtain a QD layer. The original ligand of QDs was undecanoic acid.

(1) First, a $Cd_xZn_{1-x}S/Cd_yZn_{1-y}S/ZnS$ ($0<x<1, 0<y<1$, and $x<y$) QD layer was deposited on the hole transport layer. The QD concentration was 20 mg/mL, the solvent was n-octane, and the volume was 0.8 mL.

(2) Then, 0.4 mL of 11-mercaptoundecanoic acid and 11-mercapto-1-undecanol (the molar ratio therebetween is 1:1) was added dropwise to the surface of the QD layer, and then under vacuum conditions, spin coating (speed of 1000 rpm, time of 2 min) was performed at $6 \times 10^{-4}$ Pa. After completion, 1.5 mL of isopropanol was added to rinse the surface of the QD layer.

(3) Next, 0.1 mL of HCl was added dropwise to the surface of step (2), and then the QD layer was dried at 100° C. for 60 min to obtain the ester substance bonding to the surface of the QD layer. After completion, a small amount of isopropanol was added to rinse the surface of the QD layer.

2. Fabrication of QLED

The QLED of this embodiment included, from bottom to top, an anode, a hole injection layer, a hole transport layer, a QD layer, an electron transport layer, and a cathode sequentially deposited on a substrate. The substrate was a glass substrate; the anode was ITO with a thickness of 110 nm; the hole injection layer was PEDOT:PSS with a thickness of 90 nm; and the hole transport layer was TFB with a thickness of 70 nm. The QD layer was the QD layer prepared in the above step 1, and the thickness thereof was 60 nm. The electron transport layer was ZnO with a thickness of 50 nm; and the cathode was Al with a thickness of 60 nm.

The main difference between Comparative Example 3 provided by the present disclosure and Example 3 is that the QD layer did not undergo the ligand exchange process (i.e., step (2)) and the esterification reaction process (i.e., step (3)) in the above step 1.

TABLE 1

| EQE (%) of devices prepared by comparative examples and Embodiments 1-3. | | | | | |
|---|---|---|---|---|---|
| | Comparative Example 1 | Embodiment 1 | Comparative Example 2 | Embodiment 2 | Comparative Example 3 | Embodiment 3 |
| Device EQE (%) | 3.3 | 6.2 | 4.5 | 7.6 | 3.9 | 7.9 |

The above comparative examples and the QD layers and QLEDs prepared in Embodiments 1-3 were tested for performance. The test method is as follows:

a ratio of the number of emitted photons converted from the electron-hole pairs injected into the QDs with respect to the number of the electron-hole pairs injected into the QDs, in %, is an important parameter to measure the quality of electroluminescent devices, which can be obtained by measurement using an EQE optical testing instrument. The calculation equation is as follows:

$$EQE = \eta e \eta \gamma \chi \frac{K_R}{K_R + K_{NR}}$$

where $\eta e$ is the optical output coupling efficiency, $\eta \gamma$ is the ratio of the number of recombined carriers to the number of injected carriers, $\chi$ is the ratio of the number of excitons that generate photons to the total number of excitons, $K_R$ is the radiation process rate, $K_{NR}$ is the nonradiative process rate.

It should be understood that the application of the present disclosure is not limited to the above examples, and those of ordinary skill in the art can make improvements or transformations according to the above descriptions, and all these improvements and transformations should fall within the protection scope of the appended claims of the present disclosure.

What is claimed is:

1. A quantum dot light-emitting diode (QLED), comprising:
   a quantum dot (QD) layer;
   an electron transport layer formed on the QD layer, wherein a surface of a side of the QD layer close to the electron transport layer is replaced with an ester substance and is in a polar state; and a rest area of the QD layer remains a non-polar ligand and is in a non-polar state;
   a surface the QD layer away from the electron transport layer bonds to a first ligand;
   the ester substance is formed through an esterification reaction of a second ligand and a third ligand;
   one end of a carbon chain of the second ligand is a sulfhydryl group, and another end is a carboxyl group, and the second ligand bonds to the surface of the QD layer through the sulfhydryl group; and
   one end of the carbon chain of the third ligand is a sulfhydryl group, and another end is a hydroxyl group, and the third ligand bonds to the surface of the QD layer through the sulfhydryl group.

2. The QLED of claim 1, wherein a carbon chain length of the first ligand is same as a carbon chain length of the second ligand and a carbon chain length of the third ligand forming the ester substance.

3. The QLED of claim 1, wherein a molar ratio of the second ligand to the third ligand is 1:1.

4. The QLED of claim 1, wherein the first ligand includes at least one of an organic carboxylic acid with 8 or more carbon atoms, a primary amine with 8 or more carbon atoms, a secondary or tertiary amine with 4 or more branched carbon atoms, or an organophosphine with 4 or more branched carbon atoms.

5. The QLED according to claim 1, further comprising:
   a substrate;
   an anode and a cathode formed on the substrate;
   a hole injection layer formed between the anode and the QD layer; and a hole transport layer formed between the hole injection layer and the QD layer;
   wherein the electron transport layer is located between the QD layer and the cathode.

6. The QLED according to claim 4, wherein the organic carboxylic acid includes at least one of caprylic acid, nonanoic acid, capric acid, undecyl acid, dodecyl acid, tridecyl acid, tetradecyl acid, hexadecyl acid, octadecyl acid, undecenoic acid, dodecenoic acid, tridecenoic acid, tetradecenoic acid, pentadecenoic acid, hexadecenoic acid, heptadecenoic acid, or octadecenoic acid.

7. The QLED according to claim 4, wherein the primary amine includes at least one of octylamine, nonylamine, decylamine, dodecylamine, tetradecylamine, hexadecylamine, or octadecylamine.

8. The QLED of claim 4, wherein the secondary or tertiary amine includes at least one of tributylamine, trihexylamine, triheptylamine, trioctylamine, trinonylamine, or tridecylamine.

9. The QLED according to claim 4, wherein the organic phosphine includes at least one of tributylphosphine, trihexylphosphine, triheptylphosphine, trioctylphosphine, trinonylphosphine, or tridecylphosphine.

10. A fabrication method of quantum dot light-emitting diode (QLED), comprising:
   providing a quantum dot (QD) layer having a first ligand bonding to both two surfaces of the QD layer;
   under a vacuum condition, using a second ligand and a third ligand to perform ligand exchange with the first ligand located on one of the two surfaces of the QD layer; and
   making the second ligand and the third ligand to undergo an esterification reaction to obtain the QD layer having a surface bonding to an ester substance; and
   forming an electron transport layer on the surface of the QD layer to which the ester substance bonds, wherein the surface of a side of the QD layer close to the electron transport layer is replaced with the ester substance and is in a polar state; and a rest area of the QD layer remains a non-polar ligand and is in a non-polar state,
   wherein one end of a carbon chain of the second ligand is a sulfhydryl group, and another end is a carboxyl group, and the second ligand bonds to the surface of the QD layer through the sulfhydryl group; and
   one end of the carbon chain of the third ligand is a sulfhydryl group, and another end is a hydroxyl group, and the third ligand bonds to the surface of the QD layer through the sulfhydryl group.

11. The fabrication method of the QLED according to claim 10, wherein a ratio of a total volume of the second ligand and the third ligand to a mass of QDs is 0.01-10:1 mL/mg.

12. The fabrication method of the QLED according to claim 10, wherein making the second ligand and the third ligand to undergo the esterification reaction includes:
   under a catalysis of an inorganic acid, making the second ligand and the third ligand to undergo the esterification reaction, wherein a temperature of the esterification reaction is 50-180° C., and a time of the esterification reaction is 0.5-4 hour.

13. The fabrication method of the QLED according to claim 10, further comprising:
   depositing an anode on a substrate;
   depositing a hole injection layer on the anode;
   depositing a hole transport layer on the hole injection layer;

providing the QD layer having the surface bonding to the ester substance and depositing the QD layer on the hole transport layer;

forming the electron transport layer on the QD layer; and depositing a cathode on the electron transport layer.

14. The fabrication method of the QLED according to claim 10, further comprising:

depositing a cathode on a substrate;

depositing the electron transport layer on the cathode;

providing, on the electron transport layer, the QD layer having the surface bonding to an ester substance;

depositing a hole transport layer on the QD layer, depositing a hole injection layer on the hole transport layer; and depositing an anode on the hole injection layer.

\* \* \* \* \*